United States Patent [19]
DiStefano

[11] Patent Number: 6,127,724
[45] Date of Patent: Oct. 3, 2000

[54] PACKAGED MICROELECTRONIC ELEMENTS WITH ENHANCED THERMAL CONDUCTION

[75] Inventor: Thomas H. DiStefano, Monte Sereno, Calif.

[73] Assignee: Tessera, Inc., San Jose, Calif.

[21] Appl. No.: 08/962,988

[22] Filed: Oct. 31, 1997

Related U.S. Application Data

[60] Provisional application No. 60/030,541, Oct. 31, 1996, and provisional application No. 60/038,129, Mar. 3, 1997.

[51] Int. Cl.$^7$ .......................... H01L 23/10; H01L 23/34; H01L 23/48; H01L 23/28
[52] U.S. Cl. .......................... 257/675; 257/706; 257/713; 257/737; 257/738; 257/784; 257/796
[58] Field of Search .................... 228/108, 22; 257/675, 257/706, 713, 737, 738, 784, 796

[56] References Cited

U.S. PATENT DOCUMENTS

| | | |
|---|---|---|
| 4,862,322 | 8/1989 | Bickford et al. . |
| 4,948,221 | 8/1990 | Yates . |
| 5,124,277 | 6/1992 | Tsumura . |
| 5,214,307 | 5/1993 | Davis . |
| 5,216,278 | 6/1993 | Lin et al. . |
| 5,239,198 | 8/1993 | Lin et al. . |
| 5,347,159 | 9/1994 | Khandros et al. . |
| 5,428,889 | 7/1995 | Mita et al. . |
| 5,473,512 | 12/1995 | Degani et al. . |
| 5,557,501 | 9/1996 | DiStefano et al. . |
| 5,717,252 | 2/1998 | Nakashima et al. . |
| 5,834,339 | 11/1998 | DiStefano et al. ....................... 438/125 |
| 5,866,949 | 2/1999 | Schueller . |

FOREIGN PATENT DOCUMENTS

WO 92/05582  4/1992  WIPO .

OTHER PUBLICATIONS

*Design for Minimum Chip Joint Stress*, IBM Technical Disclosure Bulletin, vol. 32, No. 7, Dec. 1989, pp. 12–13.

*Multichip Module Technologies and Alternatives: The Basics*, Doane and Franzon, Eds. 1993, pp. 429–430 and 569–613.

*Metallurgy For Engineers*, E. C. Rollason, Fourth Edition, 1973, pp. 218–220.

*Materials Handbook*, Brady et al., Thirteenth Edition, 1991, pp. 487–488.

Multichip Module–Technologies and Alternatives—The Basics: Doane and Franzon, eds. pp. 56–59 (Date Unavailable).

Primary Examiner—David E. Graybill
Attorney, Agent, or Firm—Lerner, David, Littenberg, Krumholz & Mentlik, LLP

[57] ABSTRACT

A semiconductor chip is mounted in face-up disposition on a dielectric element, with thermally conductive but flexible elements disposed between the chip bottom surface and the top surface of the dielectric element so as to provide a compliant but thermally conductive path from the chip to a substrate which is bonded to the terminals. A spreader having coefficient of thermal expansion substantially equal to that of the chip overlies the front surface and constrains an encapsulant surrounding the leads so as to minimize shear deformation of the encapsulant.

44 Claims, 6 Drawing Sheets

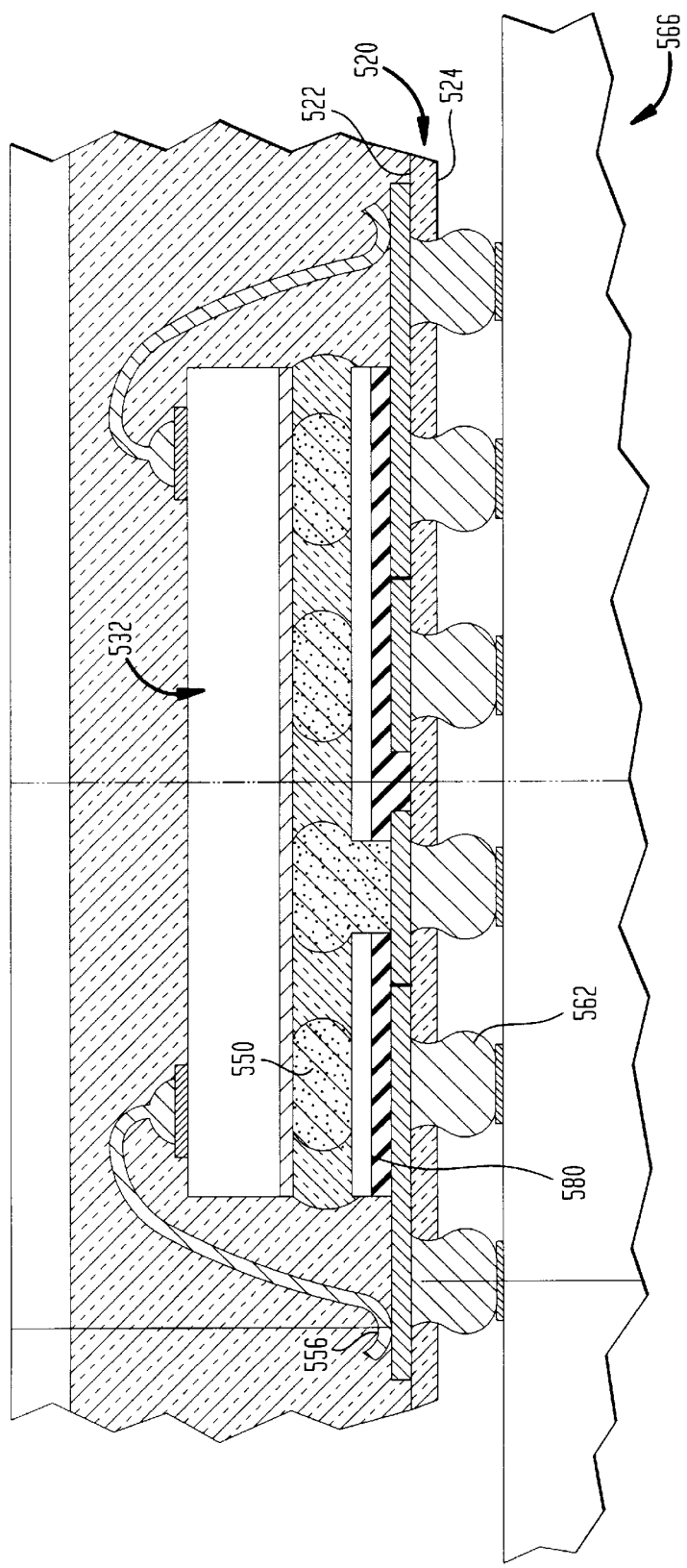

PACKAGED MICROELECTRONIC ELEMENTS WITH ENHANCED THERMAL CONDUCTION

CROSS REFERENCE TO RELATED APPLICATIONS

The present application claims benefit of U.S. Provisional Application No. 60/030,541, filed Oct. 31, 1996 and U.S. Provisional Application No. 60/038,129, filed Mar. 3, 1997, the disclosures of which are hereby incorporated by reference herein.

FIELD OF THE INVENTION

The present invention relates to the art of electronic packaging and more specifically relates to assemblies incorporating microelectronic devices such as semiconductor chips, methods of making such assemblies, and components for making the same.

Modern electronic devices utilize semiconductor integrated circuits or "chips" which incorporate numerous electronic components. These chips are mounted on substrates which physically support the chips and electrically interconnect each chip with other elements of the circuit. The substrate may be a part of a discrete chip package used to hold a single chip. Alternatively, in a so-called "hybrid circuit" or "module", one or more chips are mounted to a substrate forming a circuit panel arranged to interconnect the chips and the other circuit elements mounted on the substrate. In each case, the chip must be securely held on the substrate and must be provided with reliable electrical interconnection to the substrate. The electrical interconnections may include numerous input/output or "I/O" connections for carrying signals and/or power to the chip.

The structures utilized to provide the "first level" interconnection between a chip and the substrate should accommodate all of the electrical interconnections in a relatively compact region of the substrate. Moreover, the first level interconnection structures ordinarily are subject to strain caused by thermal cycling as temperatures in the assembly change. The electrical power dissipated within the chip tends to heat the chip and the substrate, so that temperatures of the chip and substrate rise and fall as the device is turned on and off. Differential thermal expansion of the chip and substrate cause the contacts on the chip to move relative to the connected electrical contact pads on the substrate during each heating and cooling cycle of the chip ("thermal cycling"). This tends to cause fatigue of the elements connecting individual contacts and contact pads.

The chip package should be capable of dissipating the heat generated by operation so as to limit the temperature rise of the chip. Additionally, the chip package should provide physical protection to the chip and to the electrical connections between the chip and substrate. Thus, the package should protect the chip and the electrical interconnections from corrosion or other chemical damage. The cost of the chip and the substrate assemblies is also a concern. All of these factors, taken together, present a considerable engineering challenge.

One common approach to the chip mounting problem is referred to as a "die attach/wire bond package." The die attach/wire bond package, along with other alternatives, is generally described in Multichip Module-Technologies and Alternatives—The Basics: Doane and Franzon, eds. pp. 56–69. In the die attach/wire bond process, also referred to as a "face up" wire bond package or simply as a "wire bond" package the chip is placed on a substrate with the contact-bearing front face of the chip facing upwardly, away from the substrate. The rear face of the chip is bonded to the substrate by a material commonly referred to as a die bond material. Fine gold or aluminum wires are connected between individual contacts on the chip and individual contact pads on the substrate. The entire assembly may be contained in an outer package which is filled with an encapsulant or "potting" compound such as a relatively soft silicone or other elastomer. Because the rear face of the chip is connected to the substrate by the die bond adhesive, the wire bond package provides reasonable thermal dissipation from the chip to the substrate. The individual chips must be handled in a "bare" or unpackaged condition during assembly to the substrate. This special handling, and the wire bonding process itself, require considerable care and special operations. However, typical die attach materials having very high thermal conductivity, such as silver or ceramic filled epoxies, are relatively stiff and noncompliant. When a continuous layer of such a material is applied between the chip and the substrate, it can fail during thermal cycling. Further, voids can occur in a layer of die attach material. Gases trapped in voids can cause failure of the package during service. Moreover, it is difficult to test any individual chip at full operating speed before the chip is mounted to the substrate.

As described in PCT International Publication WO 92/05582 and in U.S. Pat. No. 5,347,159, the disclosures of which are incorporated by reference herein, a semiconductor chip assembly may be provided with a flexible, sheet-like backing element overlying the rear face of the chip. Terminals on the backing element are connected to contacts on the front face of the chip, as by leads extending alongside the edges of the chip. A compliant layer may be provided between the terminals on the backing element and the chip itself, so that the terminals remain movable with respect to the chip. A cover may overlie the front of the chip and may be filled with an encapsulant. The entire assembly may be handled and mounted using essentially the same techniques as are used for surface mounting of conventional components on printed circuit boards. Thus, the terminals of the package can be bonded to contact pads on the substrate using masses of solder disposed between the terminals and contact pads. Prior to mounting, the chip assembly can be tested by engaging a test fixture with the terminals. Such a package typically provides relatively good thermal conductivity between the chip and the package so that the package can serve as a heat sink. However, such a package typically provides limited thermal conductivity between the chip and the substrate.

A chip package sold under the designation Micro-Star BGA by Sharp Corporation and by Texas Instruments, Inc. also includes a chip in a face-up disposition. A flexible polyimide film overlies the back surface of the chip. Wire bonds connect terminals on the front face of the chip to trace terminals on the flexible polyimide film. These terminals in turn can be bonded to a chip by solder balls. A die attach adhesive and a solder mask layer are interposed between the rear face of the chip and polyimide layer. The wire bonds and the chip are covered by a molded epoxy cover. Voids and delaminations in the die attach layer can cause rupture of such a package during thermal cycling. Moreover, such packages typically provide relatively low thermal conductivity from the chip to the substrate.

Additionally, encapsulated metallic conductors such as wire bonds are susceptible to fatigue failures. Typical wire bonds incorporate sharp corners and sharp changes in cross-sectional area at junctions between the fine bonding wire and the connected parts. For example, in a "ball-bond," each fine wire joins a relatively massive ball of wire material at one end. These features tend to create stress concentrations at the junctures. If the wire is flexed repeatedly during service, it can fail at such stress concentrations. Where the wire is encapsulated in a rigid material, differential thermal expansion of the chip and encapsulant can cause repeated flexure of the wire and fatigue failure. Attempts have been made to avoid such fatigue failures by using very soft encapsulants such as soft elastomers or gel. However, these attempts have not been entirely successful; fatigue failure of encapsulated wire bonds remains a significant problem, even with relatively soft encapsulants.

Accordingly, further improvements in microelectronic packaging would be desirable.

SUMMARY OF THE INVENTION

The present invention provides such further improvements. One aspect of the present invention provides a semiconductor chip assembly which includes a dielectric element, having top and bottom surfaces such as a flexible, sheetlike element. A semiconductor chip is mounted above the top surface of the dielectric element with the rear surface of the chip facing downwardly towards the dielectric element and with the front surface, bearing contacts, facing upwardly away from the dielectric element. A plurality of thermally conductive elements such as thermally conductive posts are disposed between the top surface of the dielectric element and the rear surface of the chip and most preferably these posts extend all the way from the top surface of the dielectric element to the rear surface of the chip. The dielectric element has terminals which are accessible from the bottom surface of the dielectric element so that the terminals can be connected to a substrate disposed beneath the dielectric element. Thus, the terminals may be disposed on the bottom surface, or may be accessible from the bottom surface through holes in the dielectric element. Appropriate means are provided for electrically connecting the contacts on the chip to the terminals. For example, flexible leads may extend between the contacts on the chip and conductive traces formed on the dielectric element. Thus, when the terminals are connected to contact pads on the substrate, the chip contacts are electrically connected to the contact pads of the substrate. The posts of the dielectric element and the terminals cooperatively provide a thermal conduction path from the rear face of the chip to the substrate.

Most preferably, the assembly includes a flexible rear encapsulant disposed between the rear surface of the chip and the top surface of the dielectric element, so that the rear encapsulant extends between the posts. The rear encapsulant and the posts preferably fill the space between the rear surface of the chip and the top surface of the dielectric element completely, so that there are no voids in such space. The posts desirably have some flexibility. Thus, the posts may be formed from a material such as a silver-filled epoxy or other metal-filled polymer. Even where a relatively stiff metal-filled polymer or other relatively stiff material is used, the configuration of the posts can be selected to provide reasonable flexibility and hence to permit movement of the dielectric element relative to the rear face of the chip. As discussed below, such relative movability allows compensation for thermal expansion and limits mechanical stresses in the system.

In a particularly preferred arrangement, some or all of the individual posts on the top surface of the dielectric element are disposed directly above corresponding terminals on the bottom surface of the dielectric element, so that each of these posts is directly aligned with the corresponding terminal. The aligned posts and terminals may be electrically connected to one another, or else may be separated from one another by a relatively thin dielectric layer such as a solder mask layer. In either case, the aligned posts and terminals provide a straight, low-resistance thermal path from the rear surface of the chip to the substrate when the terminals are bonded to contact pads on the substrate. In further preferred embodiments, a layer of a highly thermally conductive metal, such as copper, may be provided over the top surface of the dielectric element between the dielectric element and the individual posts to provide enhanced thermal dissipation from the chip to the substrate by providing an additional thermal conduction path. The dielectric element becomes relatively less flexible as the thickness of the layer of highly thermally conductive metal increases. The thermally conductive layer makes alignment of the posts and the solder masses less important because the layer provides horizontal conduction therebetween. The assembly thus provides good thermal dissipation from the chip to the substrate. This thermal dissipation is further aided by the rear encapsulant, which provides further thermal conductivity between the rear surface of the chip and the top surface of the dielectric element. The rear encapsulant has a thermal conductivity of approximately between about 1.0 to about 10.0 W/cm-° K.

A further aspect of the present invention provides a semiconductor chip assembly which also includes a dielectric element having top and bottom surfaces, the dielectric element having electrically conductive traces thereon. Here again, a semiconductor chip is disposed atop the dielectric element, with the rear surface of the chip facing the top surface of the dielectric element. Flexible leads extend from contacts on the front surface of the chip downwardly along side edges of the chip and join the traces on the dielectric element at bond points. The bond points are disposed in at least one edge region of the dielectric element. Each edge region is disposed alongside one edge of the chip. A dielectric encapsulant referred to herein as the "lead encapsulant" surrounds the leads and the chip. Thus, portions of the lead encapsulant are disposed between the edges of the chip and the leads.

The bond points on each edge region are disposed in a row or rows parallel to the adjacent edge of the chip and parallel to a medial plane of the chip passing through the geometric center of the chip. The distance between each row of bond points and the adjacent edge of the chip is selected so that the sum of: (1) the product of (a) the coefficient of expansion of the lead encapsulant and (b) the distance between the edge of the chip and the row of bond points and (2) the product of the coefficient of expansion of the chip and the distance from the medial plane of the chip to the edge of the chip is substantially equal to the product of the coefficient of expansion of the trace-bearing dielectric element and the distance between the medial plane of the chip and the bond points. As further discussed below, this relationship tends to minimize relative movement between the bond points and the immediately adjacent regions of the lead encapsulant upon thermal expansion or contraction of the assembly and thus tends to minimize repetitive stress in the leads at the bond points.

A further aspect of the invention provides a microelectronic assembly incorporating a chip or other microelectronic element having a front surface with contacts thereon and having flexible leads such as wire bonds extending from contacts on the front surface of the chip, the leads being connected to the contacts of joints on the front surface. Here again, a lead encapsulant, preferably a flexible encapsulant surrounds the leads and the chip. A spreader is disposed over the front surface of the chip and overlies the contacts and the adjacent regions of the lead encapsulant. Thus, the lead encapsulant extends between the chip front surface and the spreader. The spreader has a coefficient of thermal expansion close to the coefficient of thermal expansion of the chip or other microelectronic element and preferably substantially equal to the coefficient of thermal expansion of the chip. The spreader may serve as a physically protective packaging element and may also help to dissipate heat from the microelectronic element.

The spreader tends to suppress shear strain in the encapsulant in the vicinity of the contacts. Stated another way, expansion and contraction of the encapsulant are substantially constrained by the confronting surfaces of the microelectronic element and spreader. Upon heating or cooling of the assembly, the encapsulant surrounding each lead in the vicinity of the chip contact tends to move along with the contact. This minimizes shear stress in the lead at the contact. By contrast, if the encapsulant were constrained between a microelectronic element and a packaging element having coefficient of thermal expansion markedly different from that of the microelectronic element, significant shearing can occur in the encapsulant. As the encapsulant deforms in shear, it can impose significant flexual loads on the leads embedded therein. Such substantial loads can occur even if the encapsulant itself is soft. Indeed, substantial shearing loads can occur even if a soft encapsulant is unconstrained, if the encapsulant itself has a coefficient of thermal expansion substantially different from that of the microelectronic element.

In certain instances, it may be desirable to modify the shear strain which is present in the lead encapsulant. Thus, in preferred embodiments of the present invention, changes in the shear strain in the encapsulant in the vicinity of the contacts may be induced by changing the surface area of the spreader or changing the thermal mass of the spreader. For example, the surface area of the spreader confronting the chip contacts may be reduced which will, in turn, reduce the ability of the spreader to constrain the encapsulant in the vicinity of the contacts. Conversely, the thermal mass of the spreader may be increased to enhance the spreader's ability to constrain the encapsulant in the vicinity of the contacts. Alternatively, the shear strain in the encapsulant in the vicinity of the contacts may be modified by changing the geometry or shape of the lead encapsulant itself, e.g. forming the encapsulant layer with sloped sidewalls.

A package according to the most preferred embodiments of the present invention incorporates the features of all of the aspects discussed above.

A further aspect of the invention provides a method of enhancing the reliability of electrical connections in a semiconductor package during operation of the chip. The method includes the steps of providing a semiconductor chip having a front contact bearing surface and a rear surface; providing flexible leads extending from the contacts on the front surface of the chip, the flexible leads being connected to the contacts at joints on the front surface; juxtaposing a spreader above the front surface, the spreader having a coefficient of thermal expansion substantially equal to the coefficient of thermal expansion of the chip; and disposing a liquid encapsulant between the front surface and the spreader and around the leads and curing the encapsulant, whereby the motion of the leads during thermal cycling is constrained.

The foregoing and other objects, features and advantages of the present invention would be more readily apparent from the detailed description of the preferred embodiments set forth below, taken in conjunction with the accompanying drawings.

BRIEF DESCRIPTION OF THE DRAWINGS

FIG. 8 is a diagrammatic, partially sectional view of a microelectronic assembly in accordance with still another embodiment of the present invention.

DETAILED DESCRIPTION OF THE PREFERRED EMBODIMENTS

Figure 1:
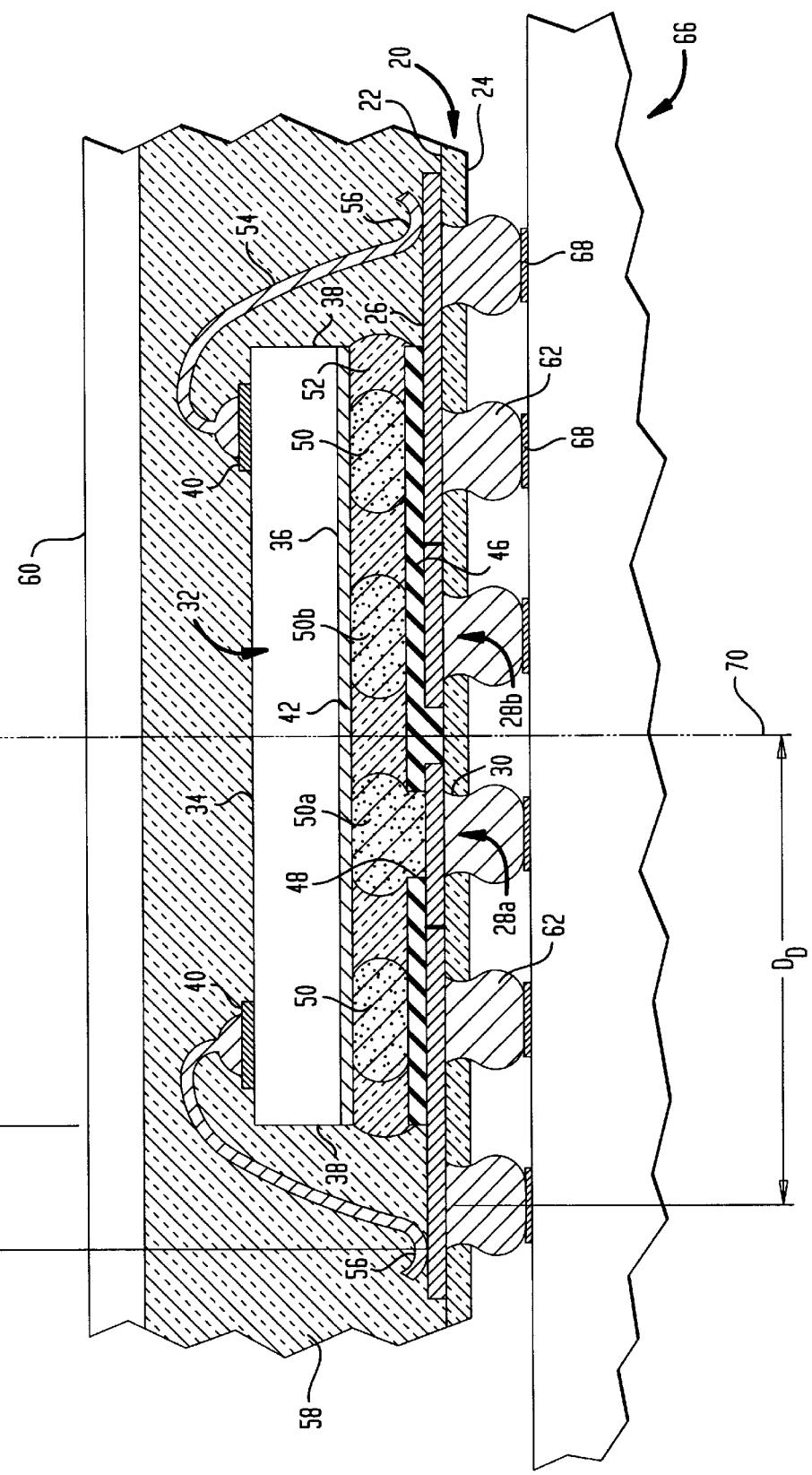
FIG. 1 is a diagrammatic, partially sectional view of a microelectronic assembly in accordance with one embodiment of the invention.

A microelectronic assembly in accordance with one embodiment of the present invention incorporates a dielectric element 20 having a top surface 22 and a bottom surface 24. Dielectric element 20 is formed as a flexible sheet of a dielectric material as, for example, a sheet of a polyimide between about 15 and about 40 microns thick and desirably about 25 microns thick. The dielectric element further includes metallic conductive traces 26 disposed on the top surface of the dielectric element. The conductive traces define terminals 28 which are exposed to the bottom surface through holes 30 in the dielectric element. Only some of terminals 28 and holes 30 are visible in FIG. 1. The terminals and holes are distributed in an array over substantially the entire sheet or dielectric element 20. Also, only some of the metallic traces 26 are visible in FIG. 1. A microelectronic element, in this case a conventional semiconductor chip 32 is disposed above the top surface of the dielectric element. Chip 32 has a top surface 34, bottom surface 36 and edges 38 extending between such surfaces. The chip is substantially rectangular and hence has additional edges (not shown) perpendicular to edges 38. Contacts 40 are disposed on the top surface 34 of the chip, in rows parallel to edges 38 and in other rows (not shown) parallel to the additional edges of the chip. The chip also has an electrically conductive potential plane 42 on back surface 36. The potential plane is arranged to serve as a ground or power potential reference plane for the internal electronic elements (not shown) incorporated in the chip.

A thin, insulating film such as a conventional solder mask 46 overlies the top surface of the dielectric element and traces 26. Film 46 desirably is less than about 40 microns thick. The film incorporates apertures 48 aligned with a few of the terminals, such as terminal 28a, visible in FIG. 1.

A plurality of thermally conductive flexible posts 50 are disposed between the bottom surface of the chip and the top surface 22 of the dielectric element. Each of the posts 50 is aligned with a terminal 28. For example, post 50b is aligned with terminal 28b. The majority of the posts are supported on insulating film 46. Post 50a, however, is aligned with aperture 48 and hence makes direct electrical contact with the aligned terminal 28a. Posts 50 are formed from a thermally and electrically conductive material. For example, a die attach adhesive such as a silver-filled epoxy of the type sold by Creative Materials, of Tyngsboro, Mass. under the designation 100-49 can be used. Posts 50 should be flexible enough to accommodate displacements of the magnitude which will be caused by thermal expansion of the chip. That is, the posts 50 should be capable of flexing through a range of movement equal to the maximum expansion of the chip relative to surrounding components. A conservative measure of such maximum movement is the product of the coefficient of thermal expansion of the chip, multiplied by the maximum distance along the lower surface of the chip from the center of the lower surface to the most remote corner; multiplied again by the maximum temperature difference to be encountered in the entire life cycle of the assembly, including manufacturing operations, testing, storage and service. The movement calculated according to this rule typically will be greater than the actual movement encountered in service. The desirable elastic modulus of the material in the posts will vary with the height of the posts. Preferably, however, the posts are between about 50 and about 250 microns high and the elastic modulus of the material in the posts is less than about one GigaPascals. Preferably, the material in the posts has a thermal conductivity of at least about 1.0 and more preferably at least about 10.0 W/cm-° K. The posts desirably occupy between about 20 to about 60% of the available area on the back surface of the chip.

A plurality of flexible leads 54 extend from contacts 40 on the chip to bond points 56 on the traces 26 of dielectric element 20. The bond points 56 are disposed in rows, in edge regions of the dielectric element disposed outboard of the edges 38 of the chip and outboard of the other edges (not shown). Thus, each row of contacts 40 along an edge of the chip is connected to a row of bond points 56 along the adjacent edge region of the dielectric element. Leads 54 may be conventional bonding wires, typically gold or aluminum bond wires. Alternatively, leads 54 may be flat, strip-like leads such as those used in tape automated bonding processes, or leads as disclosed in the aforementioned '582 International Publication. Other types of flexible leads may also be used.

A flexible rear encapsulant 52 occupies the space between the rear surface 36 of the chip and the top surface 22 of the dielectric layer, completely filling any voids left unoccupied by the posts, insulating layer 46, and traces 26. The rear encapsulant has a thermal conductivity of approximately between about 1.0 to about 10.0 W/cm-° K. A dielectric lead encapsulant 58 intimately surrounds the leads or bonding wires 54 and covers the top surface 34 of the chip as well as the top surface 22 of the dielectric layer. Lead encapsulant 58 may be of the same composition as rear encapsulant 52, or else may be a separate material. For example, rear encapsulant 52 may be loaded with a thermally conductive filler, and may be electrically conductive whereas lead encapsulant 58 may be left unloaded. Desirably, the lead encapsulant and the rear encapsulant are both flexible. The encapsulants may be a gel, an elastomer or other soft, flexible material. The encapsulants desirably have tensile modulus of elasticity or young's modulus less than 100,000 pounds per square inch (less than 670 MegaPascals) and most desirably between about 100 pounds per square inch and about 10,000 pounds per square inch (between 0.67 and 67 MegaPascals). The encapsulants preferably have hardness below about 60 on the Shore D durometer scale, more preferably between about Shore A 20 and about Shore D 60 and most preferably between about Shore A 20 and about Shore A 90. Many conventional soft potting compounds utilized in the semiconductor industry can be employed. For example, gels, elastomers, soft epoxies and the like may be used. A silicone gel of the type sold under the designation 577 by the Dow Corning Corporation of Midland, Mich. may be used. A silicone gel such as the Dow Corning DC6810 silicone gel may be used. Alternatively, a Thermoset 323 flexible epoxy encapsulant may be used.

A spreader 60 overlies the lead encapsulant 58 and overlies the front surface 34 of the chip. Spreader 60 is formed from a material having a coefficient of thermal expansion close to that of the chip. Desirably, the linear coefficient of thermal expansion of spreader 60 is between about 50% and about 200% of the linear coefficient of thermal expansion of the chip. For a conventional silicon chip having a linear coefficient of thermal expansion of about $3 \times 10^{-6}$ cm/cm-° C., the linear coefficient of thermal expansion of spreader 60 desirably is between about 1.5 and about $6 \times 10^{-6}$ cm/cm-° C. Spreader 60 desirably has a relatively high thermal conductivity. Metals such as the alloy sold under the trademark Invar, copper/Invar alloys, the alloy sold under the trademark Alloy 42, tungstem/copper alloys, molybdenum and the like can be employed. As used in this disclosure, the trademark Invar should be understood as referring to a composition of iron with 36% nickel, containing as impurities minute amounts of carbon, manganese and silicon. As used in this disclosure the trademark Alloy 42 should be understood as referring to a composition of iron with 42% nickel. Preferably, the lead encapsulant 58 is bonded to spreader 60 and chip 32. The lead encapsulant as would be appreciated may, and typically does, have a coefficient of thermal expansion in its free or unconstrained state substantially different from that of the chip. For example, typical silicone encapsulants have linear coefficients of thermal expansion on the order of about 400–600 cm/cm-° C. While it is preferable that the spreader be metallic, other CTE matched materials may be used as well such as silicon and alumina, as well as others.

Electrically and thermally conductive bonding material 62, preferably a metallic bonding material such as conventional solder masses, may be provided on the bottom surfaces of terminals 28 so that the bonding material masses 62 protrude from the bottom surface 24 of the dielectric element. In use, the assembly can be handled, stocked and transported as a unit. Spreader 60 and encapsulant 58 protect the delicate leads 54 and chip 32. The assembly can also be tested as by engaging the solder masses 62 with contacts of a test fixture and actuating the chip. The assembly can be mounted on a conventional substrate such as circuit panel 66 by juxtaposing the solder masses 62 with bonding pads 68 on the substrate and heating the assembly in the conventional manner to melt the solder and then cooling the assembly. These steps may be performed by the same procedures used to mount a conventional surface mounted component. Once mounted in this fashion, terminals 28 and hence traces 26, leads 54, and contacts 40 are electrically connected to the contact pads 68 of the substrate. Conductive posts 50a and other, similar posts having contact with terminals 28 electrically connect the ground or potential plane 42 of the chip with the appropriate ground or power contact pads of the substrate. The remaining posts 50 do not make electrical connections. However, all of the aligned posts 50, terminals 28 and solder masses 62 provide short, low resistance thermal conduction paths from the bottom surface of the chip to the substrate and thus help to provide effective heat transfer from the chip to the substrate. This limits the temperature rise of the chip.

Several features of the design tend to limit thermal stresses applied to the leads during mounting and service. Because spreader 60 and chip 32 have similar coefficients of thermal expansion, both tend to expand and contract by approximately the same amounts during temperature changes. That portion of lead encapsulant 58 surrounding contacts 40 and surrounding the adjacent portions of leads 54 is constrained between the spreader and the chip top surface 34. The lead encapsulant in this region thus tends to move with the chip and the spreader. Therefore, there is little, if any, shear strain in the lead encapsulant in the vicinity of contacts 40 and the adjacent regions of leads 54. Accordingly, the relatively delicate joints between the leads and contacts 40 are effectively protected from flexure during thermal cycling.

Moreover, the dimensions of the parts are selected so that movement of the bond points 56 on the dielectric layer is substantially equal to the movement of the immediately adjacent portions of the lead encapsulant during thermal expansion and contraction. Movement of the parts of the assembly is discussed herein with reference to the center of the chip or microelectronic element. Thus, movement of elements in directions to the right and left as seen in FIG. 1 is taken with reference to the medial plane 70, equidistant from edges 38. For the bond points 56 lying alongside edges 38 of the chip, movement of the lead encapsulant surrounding bond points 56 during a given change in temperature is substantially equal to the sum of the movement of edge 38 and the thermal expansion of that portion of the encapsulant lying between edges 38 and bond points 56. That sum is given by $$D_{C_e}C + D_{E_e}E \quad (1)$$

where: $D_c$ is the distance from a given edge 38 to medial plane 70 of the chip; $\epsilon_c$ is the linear thermal coefficient of expansion of the chip material; $D_c$ is the distance from edge 38 of the chip to bond point row 56; and $\epsilon_c$ is the linear coefficient of expansion of the lead encapsulant. The movement of the bond points 58 on the dielectric layer and traces is the product of $D_D$, the distance from medial plane 70 to the bond points and $\epsilon_D$, the linear coefficient of expansion of the dielectric layer and traces. Typically, the thermal expansion of the metallic traces controls the thermal expansion of the dielectric layer. That is, the coefficient of thermal expansion of the dielectric layer in directions parallel to traces 26 can be taken as equal to the thermal coefficient of expansion of the copper material in the traces, i.e., about $150 \times 10^{-6}$ cm/cm-° C. Thus, the dimensions are selected so that $$D_{D_e}D = D_{C_e}C + D_{E_e}E \quad (2)$$

Similar selections are made with respect of the rows bond points adjacent the other edges of the chip (not shown). In each case, the medial plane used as the base of measurement is the plane parallel to the particular edge of the chip and passing through the geometric center of the chip bottom surface. Thermal expansion matching achieved by selection of dimensions in the foregoing manner does not assure absolute absence of shear at bond points 56. For example, temperatures in the system may vary in a non-uniform manner. Also, when the assembly has been bonded to a substrate, the dielectric layer is bound to the substrate so that expansion and contraction of the substrate may dominate expansion and contraction of the dielectric layer. Preferably, however, the substrate has a coefficient of thermal expansion close to that of the dielectric layer 20 with lead traces thereon. For example, substrate 66 may be another copper and polyimide structure. Moreover, the most severe thermal cycling in the history of the device typically occurs during solder bonding, before the dielectric layer is physically bound to the substrate. Therefore, selection of dimensions in the manner discussed above will provide useful reductions in thermal stress during this critical time.

Figure 2:
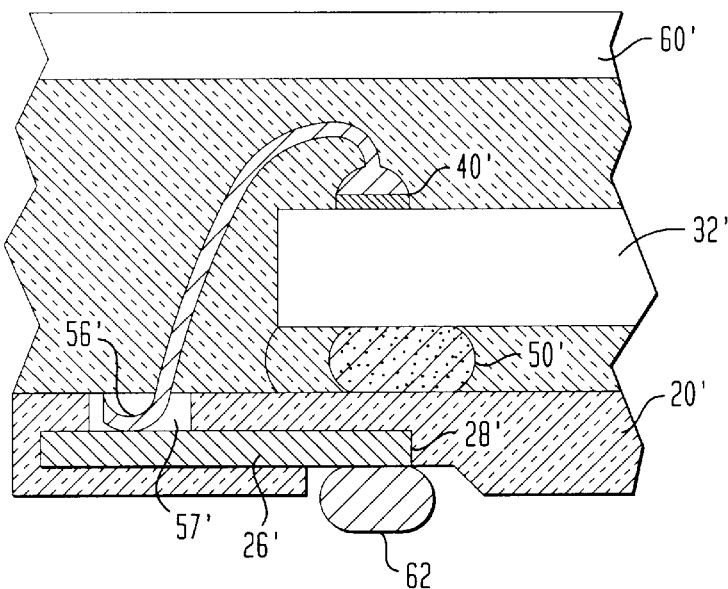
FIG. 2 is a fragmentary, diagrammatic sectional view depicting portions of an assembly in accordance with a further embodiment of the invention.

As shown in FIG. 2, an assembly in accordance with a further embodiment of the invention includes a chip 32' similar to that discussed above having contacts 40' on its top surface, as well as a spreader 60' overlying the contact-bearing top surface of the chip as discussed above. The assembly further includes a dielectric element 20' generally similar to that discussed above with reference to FIG. 1, except that the traces 26' of layer 20' are embedded within the dielectric layer. For example, dielectric element 20' may be a composite structure including two or more dielectric layers laminated together. Traces 26' are exposed to the top surface of the dielectric element at bond points 56' through holes or slots 57' in the top portion of the dielectric element. Accordingly, there is no need for a separate solder mask layer such as the solder mask layer 46 used in the embodiment of FIG. 1. Here again, posts 50' are aligned with terminals 28' and hence aligned with the bonding material or solder masses 62 applied to the terminals. The aligned posts and terminals provide efficient paths for heat conduction to the bottom of the assembly. Desirably, the thickness of dielectric element 20' is limited so that the thermal resistance between each post 50' and the aligned terminal 28' is small. For example, the thickness of a polyimide layer intervening between posts 50' and terminals 28' desirably is less than 40 microns.

Figure 3:
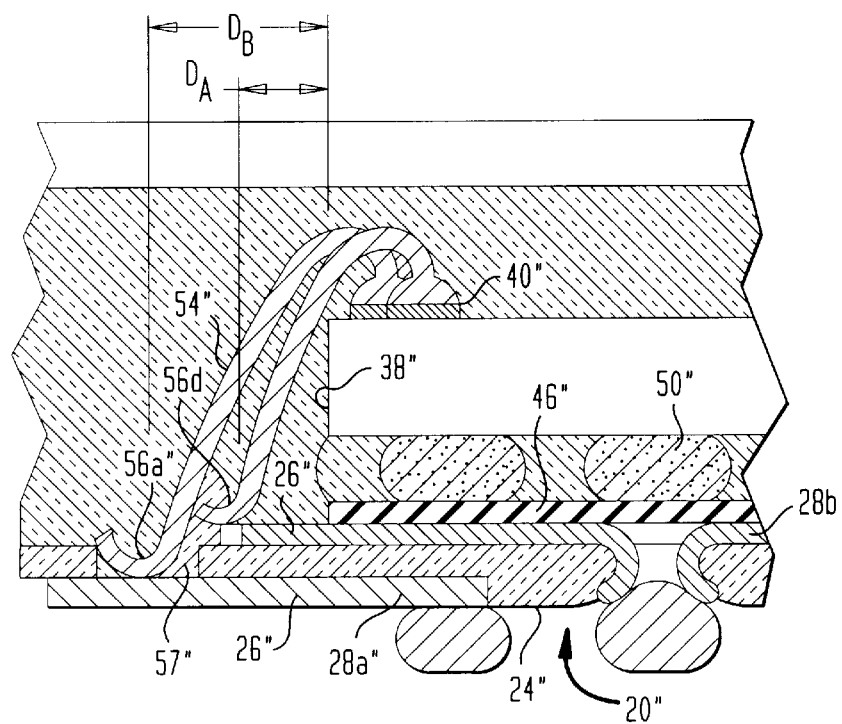
FIG. 3 is a view similar to FIG. 2 but depicting portions of an assembly in accordance with yet another embodiment of the invention.

The embodiment illustrated in FIG. 3 is similar, except that the dielectric layer 20" has traces 26" both on its top surface and on its bottom surface. Some of the terminals, such as terminal 28a" are flat structures disposed on the bottom surface 24" of the dielectric element, whereas other terminals 28b" include metallic structures such as via liners extending through the thickness of the dielectric element. These metallic structures also enhance the thermal conductivity of the structure in the vertical direction, from the top surface towards the bottom surface. As in the embodiments discussed above with reference to FIG. 1, an additional thin dielectric layer 46" overlies the top surface of the dielectric element. Here again, apertures can be provided in such layer to connect some of the posts 50" to traces and/or terminals on the top surface. In each edge region of the dielectric element, the bond points 56 where the flexible leads 54" join the traces 26" are disposed in two rows 56a" and 56b" extending parallel to edge 38" of the chip. Thus, some of the leads extending from the contacts 40" join the traces 26" on the top surface of the dielectric element at a first row of bond points 56a", whereas other leads 54 and traces 26" on the bottom surface 24" at bond points 56". Here again, the dielectric element is provided with one or more apertures, such as one or more elongated slots, to accommodate each row of bond points 56a" for the lower surface traces. In other respects, the embodiment of FIG. 3 is similar to those discussed above. The multilayer structure of FIG. 3 may incorporate more than two layers of traces and more than two rows of bond points associated with each edge of the chip. For example, a layer of traces extending in the middle of the dielectric element, such as traces 26' discussed above with reference to FIG. 2, may be provided. As would be appreciated, in any such structure which incorporates multiple rows of bond points positioned at different distances $D_A$ and $D_B$ from the adjacent edge 38" of the chip, it is impossible to select both distances to match precisely the desired distance $D_E$ calculated above. Preferably, both such distances $D_A$ and $D_B$ approximate the desired distance $D_E$.

Figure 4:
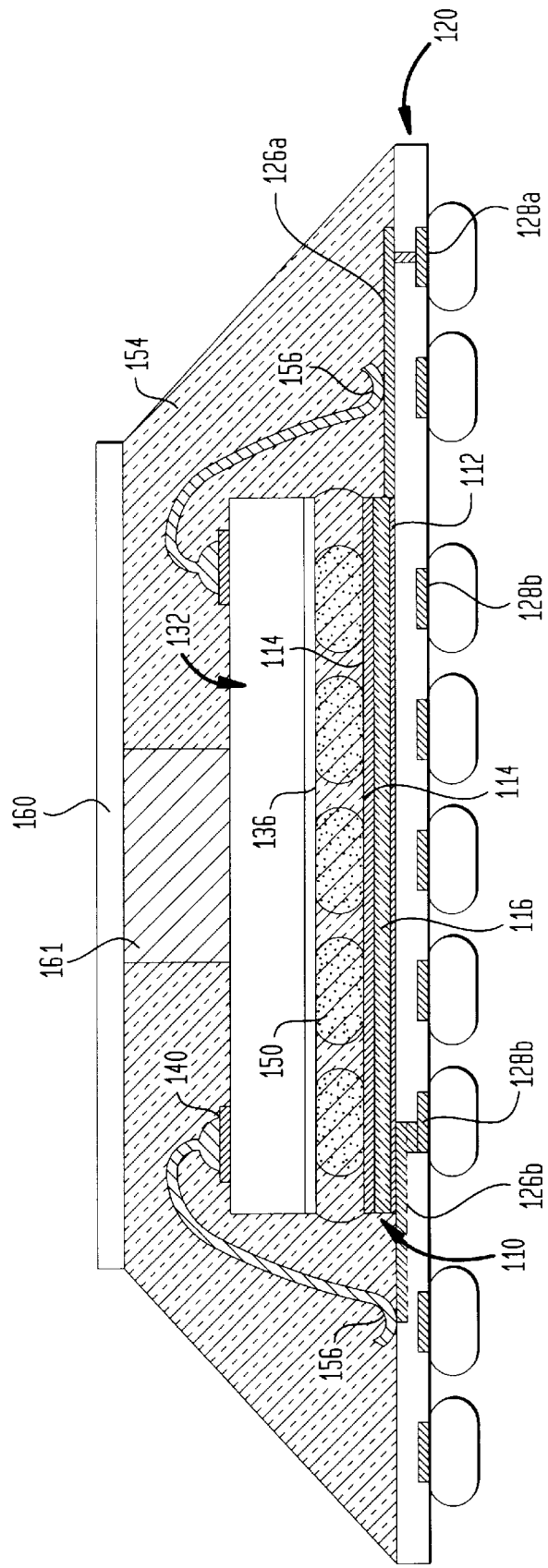
FIG. 4 is a diagrammatic sectional view depicting an assembly in accordance with yet another embodiment of the invention.

The assembly of FIG. 4 is generally similar to the assembly of FIG. 1 discussed above. However, dielectric element 120 has terminals 128a disposed in peripheral regions of the dielectric element, outboard of bond rows 156 in addition to terminals 128b, in the central region beneath chip 132. Thus, the terminals of dielectric element 120 provide a "fan-in" and "fan-out" arrangement. Some of the traces 126a extend outwardly from their bond points 156 to their connected terminals 128a, whereas other traces 126b extend inwardly from their bond points to their connected terminals 128b. A capacitor 110 having a conductive bottom plate 112, conductive top plate 114 and dielectric layer 116 between the top and bottom plates is disposed over the central region of the dielectric element. Thus, thermally conductive posts 150 are separated from the dielectric element and from terminals 128b by the intervening capacitor. However, the capacitor does not provide a large thermal resistance between the posts and the terminals. Conductive layers 112 and 114 desirably are metallic and have relatively high thermal conductivity. Dielectric layer 116 typically is less than about 40 microns thick and hence adds little thermal resistance to the structure. A thin dielectric film (not shown) may be provided atop the top conductive layer 114 of the capacitor to electrically insulate posts 150 from the capacitor if desired. Preferably however, posts 150 remain electrically connected to the top layer 114 of the capacitor so that all of the posts electrically connect the top layer of the capacitor to the potential plane layer 136 on the bottom surface on chip 132. The conductive layers 112 and 114 of the capacitor are connected to one or more of terminals 128 and desirably are also connected to one or more of the flexible leads 154 which serve as ground and power leads to the chip. For example, trace 126a, as seen in FIG. 4, is electrically connected to the bottom plate 112. This provides a compact package with on-board capacitance to compensate for inductances in the leads. Two or more capacitors may be provided in the package. These may be stacked atop one another or, preferably, provided alongside one another. Additional capacitors may be provided over the peripheral regions of the dielectric element, outboard of bond points 156 and overlying the outboard terminals 128a.

In the assembly of FIG. 4, posts 150 are aligned with terminals 128b of the central region in the manner discussed above, to provide straight, vertical heat conduction paths from chip 132 to the terminals. However, some or all of the posts can be out of alignment with the terminals. The degree of increase in thermal resistance caused by such misalignment depends on the degree of misalignment or horizontal distance, in the plane of dielectric element 120, from each post to the nearest terminal. The greater such misalignment, the greater the increase in thermal resistance. Preferably, the degree of misalignment or horizontal distance from each post 150 to each terminal 128 is less than about 100 microns. Where metallic elements of the structure, such as the conductive layers 112 and 114 of a capacitor or traces 126 provide substantial thermal conductivity in horizontal directions, the effects of terminal-to-post misalignment are reduced. For example, the capacitor can be provided with a relatively thick metallic top or bottom plate to enhance the thermal conductivity of the dielectric element in horizontal directions parallel to the surfaces of the element.

The assembly of FIG. 4 further includes a thermally conductive plug 161 disposed between the top surface of chip 132 and spreader plate 160. Plug 161 is bonded to both the top surface of the chip and the spreader plate and provides a low-resistance thermal path from the chip to the spreader. This enhances heat dissipation from the chip and also tends to equalize the temperatures of the spreader and chip. This further reduces shear in those regions of the lead encapsulant disposed between the top surface of the chip and the spreader and thus further reduces bending stress in those portions of leads 156 overlying the top surface, such as the lead portions adjacent contacts 140 of the chip.

Packages according to the foregoing embodiments can be fabricated by a process which starts with a preformed dielectric element having the traces and terminals discussed above. If capacitors as discussed above with reference to FIG. 4 are to be provided in the assembly, they may be included in the prefabricated dielectric element. The dielectric element typically is provided in the form of a tape with features such as sprocket holes and alignment masks (not shown). Posts, such as posts 50 (FIG. 1), are formed by silk screening a curable material such as the die attach adhesives discussed above. The chip or die 132 is then applied on the posts and the conductive material is cured. Leads 54 are applied by conventional bonding techniques such as conventional wire bonding. Spreader 60 is positioned above the front surface of the chip and a flowable, curable material is injected between the spreader and the dielectric element so that the curable liquid completely fills the spaces between the spreader 60 and dielectric element 20, including the spaces beneath chip 32, between posts 50. Complete filling, without voids, can be enhanced by application of pressure to the liquid during the filling process. For example, after application of the liquid but prior to curing, the assembly can be subjected to a pressure of about 10 to about 1000 pounds per square inch. As described in greater detail in copending, commonly assigned U.S. patent application Ser. No. 08/610, 610, U.S. Pat. No. 5,834,339, the disclosure of which is hereby incorporated by reference herein, application of such pressure can cause any voids which are initially present in a confined layer of liquid encapsulant to shrink and disappear. Although the present invention and the '610 application are not limited by any theory of operation, it is believed that such shrinkage results in part from dissolution of the gases contained in the voids in the liquid material. After the liquid material is applied, it is cured to form the lead encapsulant 58 and a rear encapsulant 52 of the same composition. In an alternative procedure, where a rear encapsulant 52 of different composition from the lead encapsulant 58 is desired, a liquid material adapted to form the rear encapsulant is applied after posts 50 are cured but before bonds 54 are installed.

Figure 5:
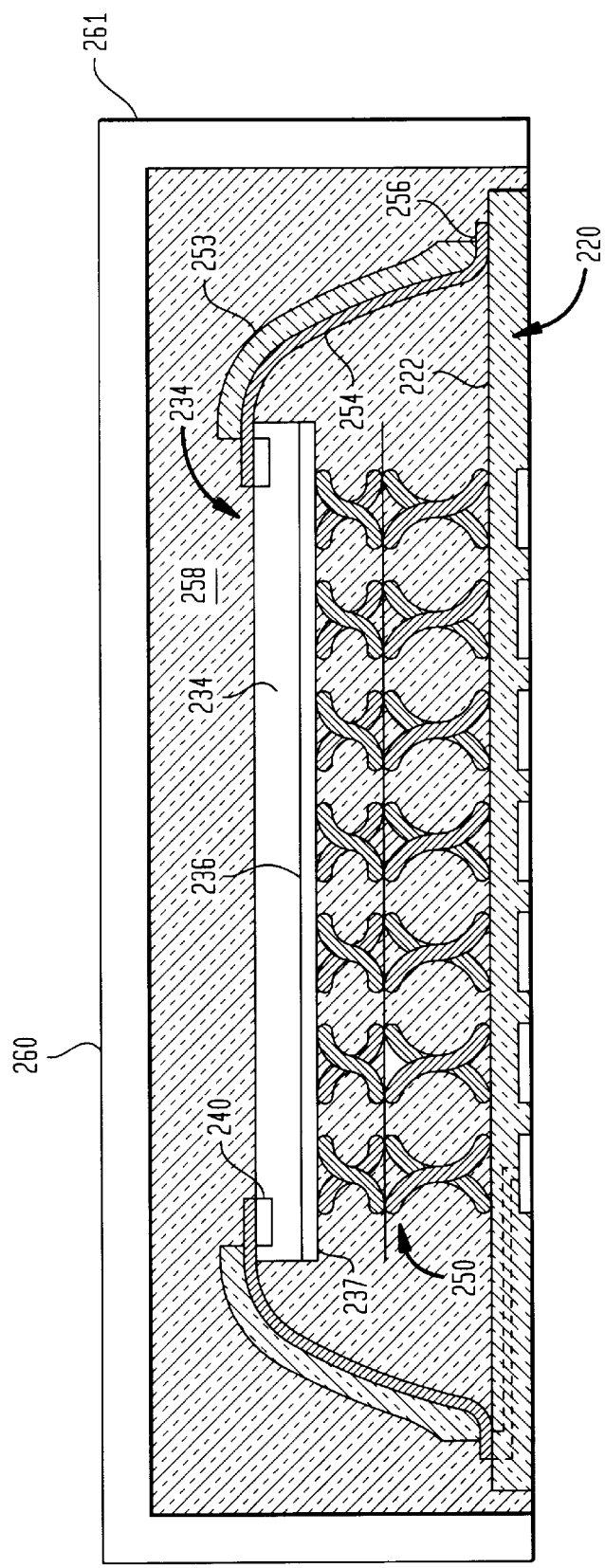
FIG. 5 is a view similar to FIG. 4 but depicting an assembly in accordance with another embodiment of the invention.

Numerous variations and combinations of the features discussed above may be utilized without departing from the present invention as defined by the claims. For example, the shape and configuration of the spreader may be varied as desired. The spreader may be provided with features such as fins to facilitate dissipation of heat from the spreader. Also, the spreader may be formed as a "can" or "shroud" extending downwardly adjacent the edges of the dielectric element so that sidewalls of the spread protect the edges of the encapsulant-filled space. As shown in FIG. 5, posts 50 may be replaced by compliant thermal connectors as described in U.S. Pat. No. 5,557,501, the disclosure of which is hereby incorporated by reference herein. Numerous flexible thermal conductors formed from elongated metallic strips as described in the '501 patent are interposed between the bottom surface 236 of the chip 234 and the top surface 222 of dielectric element 220. As described in greater detail in the '501 patent, such thermal connectors can be formed by prefabricating striplike elements in flat configuration, connecting these elements between a pair of opposed elements and then moving the opposed elements away from one another to bend the striplike elements into the desired curved, final configuration. A platelike carrier 237 may be provided with some of the flat striplike elements, whereas others of the flat striplike elements may be formed on the top surface 222 of dielectric element 220. The flat striplike elements may be deformed to the curved configurations, to form the flexible thermal connectors 250 as depicted in FIG. 5 either before or after mounting chip 234 to platelike element 237.

The structure of FIG. 5 also has leads 254 provided as traces on a flexible dielectric sheet 253 similar to a conventional tape automated bonding or "TAB" tape. Leads 254 may be bonded to the contacts 240 of chip 234, and to bond points 256 on dielectric element 220 by processes such as employed in conventional TAB bonding. Where chip 234 is attached to platelike carrier 237 prior to the moving step discussed above, the TAB bonding step can be performed before the moving step, while platelike element 237 and chip 234 are positioned immediately above the dielectric element 220. Following this TAB bonding step, the chip may be moved away from dielectric element 220 so as to deform the striplike elements and form the thermal conductors 250 while also deforming the flexible tab tapes 253 to the condition illustrated in FIG. 5. Some "slack" may be provided in the TAB leads to accommodate this movement and bending, as by providing a fold or bend in the TAB tapes or the leads. Alternatively, the tab bonding step may be performed after positioning the chip in its final relationship to the dielectric element.

The spreader 260 depicted in FIG. 5 incorporates sidewalls 261 extending downwardly adjacent the edges of the package so as to protect the encapsulant 258 chip and leads from mechanical damage. In this embodiment, the same encapsulant 258 fills the entire package, including the spaces between thermally conductive elements 250, beneath chip 234.

Figure 6:
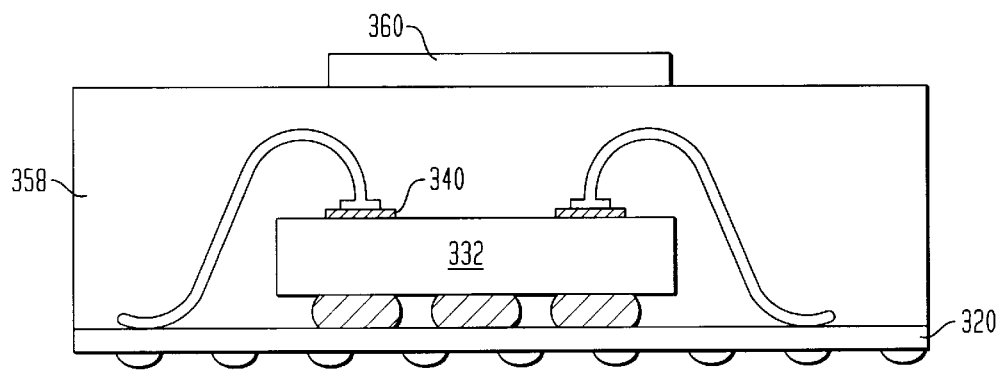
FIG. 6 is a diagrammatic, partially sectional view of a microelectronic assembly in accordance with another embodiment of the present invention.

FIG. 6 shows another embodiment of the present invention whereby the level of shear strain in the encapsulant in the vicinity of the contacts has been modified by changing the surface area of the spreader 360. For example, the spreader 360 shown in FIG. 6 is substantially smaller in surface area than the spreader 60 shown in FIG. 1 so that the encapsulant extends beyond the spreader. Thus, the constraining force exerted by the spreader 360 is reduced, which in turn changes the shear stress in the encapsulant 358 in the vicinity of the contacts 340 on the chip 332. In alternative embodiments, the thermal mass of the spreader 360 may be modified to change the shear stress in the encapsulant 358 in the vicinity of the contacts 340.

Figure 7:
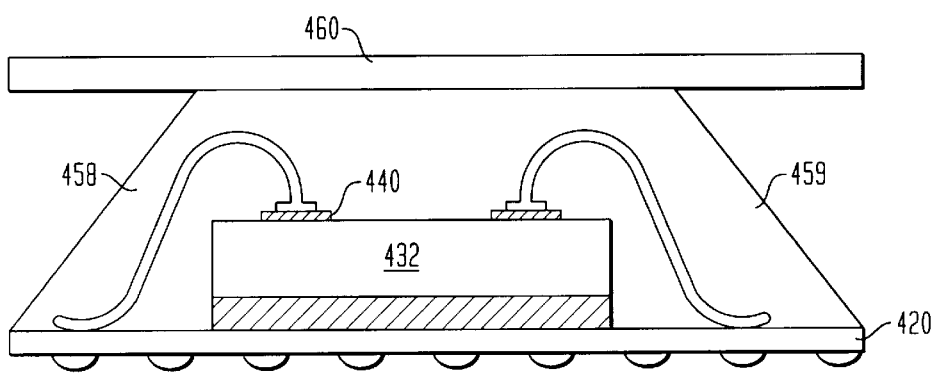
FIG. 7 is a diagrammatic, partially sectional view of a microelectronic assembly in accordance with yet another embodiment of the present invention.

FIG. 7 shows further embodiments for modifying the shear stress in the encapsulant. In these preferred embodiments, the shear stress is modified by changing the geometry or shape of the encapsulant layer 458. For example, in FIG. 7 the side walls 459 of the encapsulant 458 are sloped outwardly from the top to the bottom. Also, the spreader extends outwardly beyond the encapsulant at the top of the assembly. It is contemplated that other modifications to the geometry of the encapsulant are possible to modify the level of shear stress, e.g. concave sidewalls.

FIG. 8 shows a still further embodiment of the present invention which is similar to the assembly shown in FIG. 1 and described above; however, the assembly shown in FIG. 8 includes a layer 580 of a highly thermally conductive metal which is provided between the top surface 522 of the dielectric element 520 and the individual thermally conductive posts 550 disposed between the bottom surface of the chip 532 and the dielectric element 520. The highly conductive metal layer 580 preferably includes copper, however, other highly conductive metals may be utilized. The layer 580 preferably has a thickness between approximately one (1) to seven (7) mils. The thickness of the conductive metal layer 580 shown in FIG. 8 is greatly exaggerated for purposes of clarity. The highly conductive metal layer 580, which preferably overlies the top surface 522 of the dielectric element 520, provides enhanced thermal dissipation from the chip 532 to the substrate 566 by providing an additional thermal conduction path. The thermally conductive layer 580 makes alignment of the posts 550 and the solder masses 562 less important because the layer 580 provides horizontal conduction therebetween. The relative flexibility of the dielectric element 520 is reduced as the thickness of the layer of the highly conductive material 580 increases.

As these and other variations and combinations of the features discussed above can be utilized without departing from the present invention as defined by the claim, the foregoing description of the preferred embodiment should be taken by way of illustration rather than by way of limitation of the invention as claimed.

What is claimed is:

1. A semiconductor chip assembly comprising:
   (a) a dielectric element having top and bottom surfaces;
   (b) a semiconductor chip having a front surface with contacts thereon, a rear surface and edges extending between said front and rear surfaces, said chip being disposed above said top surface of said dielectric element with said rear surface facing downwardly towards said dielectric element and said front surface facing upwardly away from said dielectric element so that there is a space between said rear surface of said chip and said top surface of said dielectric element;
   (c) a plurality of thermally conductive elements having thermal conductivity of at least about 1.0 W/cm-° K extending between said top surface of said dielectric element and said rear surface of said chip;
   (d) a plurality of terminals on the bottom surface of said dielectric element; and
   (e) means for electrically connecting said contacts of said chip to said terminals on the bottom surface of said dielectric element, whereby, when said terminals are connected to a contacts on a substrate, said terminals and said electrical connecting means cooperatively connect said contacts of said chip to the contacts on the substrate, whereas said thermally conductive elements, said dielectric element and said terminals cooperatively provide a thermal conduction path from said rear face of said chip to the substrate.

2. An assembly as claimed in claim 1 wherein said dielectric element is flexible.

3. An assembly as claimed in claim 2, further comprising a layer of a thermally conductive material having thermal conductivity higher than the thermal conductivity of said dielectric element disposed between said thermally conductive elements and said top surface of said dielectric element said layer of thermally conductivity material extending horizontally between said thermally conductive elements.

4. An assembly as claimed in claim 3, wherein said layer of a thermally conductive material includes metal.

5. An assembly as claimed in claim 3, wherein said layer of a thermally conductive material overlies the top surface of said dielectric element and is between approximately 1 to 7 mils thick.

6. An assembly as claimed in claim 2 further comprising a flexible rear encapsulant disposed between said rear surface of said chip and said top surface of said dielectric element, said rear encapsulant extending between said thermally conductive elements.

7. An assembly as claimed in claim 6 wherein said rear encapsulant and said thermally conductive elements completely fill the space between said rear surface of said chip and said top surface of said dielectric element so that there are no voids in said space between said rear surface of said chip and said top surface of said dielectric element.

8. An assembly as claimed in claim 6 wherein said rear encapsulant has thermal conductivity of approximately between about 1.0 to about 10.0 W/cm-° K.

9. An assembly as claimed in claim 6 wherein said rear encapsulant includes a metal dispersed in a polymer.

10. An assembly as claimed in claim 1, wherein said plurality of thermally conductive elements have thermal conductivity of approximately between about 1.0 to about 10.0 W/cm-° K.

11. An assembly as claimed in claim 6 wherein said means for electrically connecting includes conductive traces on said dielectric element and flexible leads extending between said contacts on said chip and said traces.

12. An assembly as claimed in claim 11 further comprising a lead encapsulant surrounding said leads, said lead encapsulant being contiguous with said rear encapsulant.

13. An assembly as claimed in claim 12 wherein said lead encapsulant and said rear encapsulant have the same composition and are formed integrally with one another.

14. An assembly as claimed in claim 12 wherein said lead encapsulant is dielectric and said rear encapsulant is electrically and thermally conductive.

15. An assembly as claimed in claim 12 wherein said dielectric element includes at least one edge region projecting laterally beyond the edges of said chip, said traces extending between said edge region and said terminals, said flexible leads including bond wires extending from said contacts downward alongside of at least one edge of the chip and joining said traces at bond points in at least one said edge region.

16. An assembly as claimed in claim 2 wherein said thermally conductive elements include a plurality of posts.

17. An assembly as claimed in claim 16 wherein said posts are formed from a metal-loaded polymeric material.

18. An assembly as claimed in claim 16 wherein at least some of said posts are aligned with at least some of said terminals so that said aligned posts and terminals define straight, vertical heat conduction paths.

19. An assembly as claimed in claim 2 wherein said terminals include metallic masses adapted for metallurgical bonding with contacts on a substrate.

20. An assembly as claimed in claim 2 wherein said thermally conductive elements occupy at least 20 percent of the area of said substrate top surface underlying said chip.

21. An assembly as claimed in claim 1 further comprising a flat capacitor disposed on said dielectric element and connected to said chip.

22. An assembly as claimed in claim 21 wherein at least some of said thermally conductive elements are electrically conductive and connect said capacitor to said chip.

23. A semicolon chip assembly comprising:

(a) a dielectric element having top and bottom surfaces and having electrically conductive traces thereon;

(b) a semiconductor chip having a front surface with contacts thereon, a rear surface, a first edge extending between said front and rear surfaces, and a first medial plane passing through the geometric center of said rear surface parallel to said first edge, said chip overlying said top surface of said dielectric element with said rear surface facing downwardly towards said dielectric element and said front surface facing upwardly away from said dielectric element, said dielectric element and said traces having a first edge region, extending beyond said first edge of the chip;

(c) flexible leads extending from said contacts on said front surface of said chip downwardly alongside the edges of said chip and joining the traces on the dielectric element at bond points, (d) a lead encapsulant surrounding said leads and said chip, whereby said lead encapsulant is disposed between the edges of the chip and the leads, said bond points being disposed in one or more rows, said one or more rows including a first row of bond points disposed in said first edge region parallel to said first edge of the chip, and parallel to said first medial plane of the chip, said first row of bond points being disposed at a first distance from the first edge of the chip such that:

(i) the sum of (1) the product of the coefficient of expansion of the lead encapsulant and the distance between the first edge of the chip and the first row of bond points; and (2) the product of the coefficient of expansion of the chip and the distance from the first medial plane of the chip to the first edge of the chip; is substantially equal to (ii) the product of the coefficient of expansion of the dielectric element with said traces thereon and the distance from the first medial plane of the chip to the first row of bond points.

24. An assembly as claimed in claim 23 wherein said terminals are disposed on said bottom surface of said dielectric element.

25. An assembly as claimed in claim 24 wherein said leads include flexible metallic bond wires.

26. An assembly as claimed in claim 23 or claim 24 wherein at least some of said traces extend along said bottom surface of said dielectric element.

27. An assembly as claimed in claim 26 wherein some of said traces extend along said top surface of said dielectric element.

28. An assembly as claimed in claim 27 wherein at least some of said traces on said bottom surface and at least some of said traces on said top surface extend to said first edge region of said dielectric element, and wherein some of said leads join said traces on said top surface in said first row of bond points at said first distance from said first edge of said chip and others of said bond wires join said traces on said bottom surface in a second row of bond points disposed at a second distance from said first edge of said chip, said second distance being greater than said first distance.

29. An assembly as claimed in claim 15 or claim 24 or claim 25 wherein some of said terminals are disposed in peripheral regions of said dielectric element further from said chip than said bond points.

30. A semiconductor chip assembly comprising:

(a) a semicolon chip having a front surface with contacts thereon, a rear surface and edges extending between said front and rear surfaces, (b) flexible leads extending from said contacts on said front surface of said chip, said flexible leads being connected to said contacts at joints on said front surface;

(c) a spreader disposed over said front surface of said chip and overlying said contacts, said spreader having a coefficient of thermal expansion substantially equal to the coefficient of thermal expansion of said chip; and (d) a flexible lead encapsulant surrounding said leads and said chip, said lead encapsulant extending between said chip front surface and said spreader, whereby said spreader will tend to suppress shear strain in said encapsulant in the vicinity of said contacts.

31. An assembly as claimed in claim 30, wherein said spreader includes a material selected from the group consisting of Invar, Copper/Invar, Alloy 42, Tungsten/Copper and Molybdenum.

32. An assembly as claimed in claim 30 wherein said flexible leads include metallic bond wires, and wherein said joints include metal balls integral with said wires bonded to said contacts.

33. An assembly as claimed in claim 32 wherein said bond wires extend outwardly from said joints and downwardly alongside the edges of said chip.

34. An assembly as claimed in claim 30 further comprising a dielectric element disposed beneath said rear surface of said chip, said dielectric element having top and bottom surfaces and terminals on said bottom surface, said chip overlying said top surface of said dielectric element with said rear surface facing downwardly towards said dielectric element and said front surface facing upwardly away from said dielectric element, said flexible leads being electrically connected to said terminal.

35. An assembly as claimed in claim 34 wherein at least some of said terminals are disposed in a central region of said dielectric element beneath said chip, said dielectric element having at least one edge region extending beyond at least one edge of the chip and electrically conductive traces extending between said terminals and said edge region, said flexible leads being joined to said traces at bond points in said edge region.

36. An assembly as claimed in claim 30 further comprising a thermally conductive element extending between said front face of said chip and said spreader.

37. An assembly as claimed in claim 30, wherein said spreader extends beyond said encapsulant in the vicinity of said contacts.

38. An assembly as claimed in claim 30, wherein said encapsulant in the vincinity of said contacts extends beyond said spreader.

39. An assembly as claimed in claim 30, wherein said encapsulant is shaped or molded in a geometry so as to moderate shear stress in said encapsulant in the vicinity of said contacts.

40. An assembly as claimed in claim 30, wherein said encapsulant has a sloping face adjacent said leads.

41. An assembly as claimed in claim 15 or wherein at least some of said traces extend along said bottom surface of said dielectric element.

42. An assembly as claimed in claim 41 wherein some of said traces extend along said top surface of said dielectric element.

43. An assembly as claimed in claim 42 wherein at least some of said traces on said bottom surface and at least some of said traces on said top surface extend to a common edge region of said dielectric element projecting outwardly beyond a first edge of said chip, and wherein some of said leads join said traces on said top surface in a first row of bond points at a first distance from said first edge of said chip and others of said bond wires join said traces on said bottom surface in a second row of bond points disposed at a second distance from said first edge of said chip, said second distance being greater than said first distance.

44. An assembly as claimed in claim 1 wherein at least some of said terminals are disposed in a central region of said dielectric element underlying said chip.

* * * * *

UNITED STATES PATENT AND TRADEMARK OFFICE
CERTIFICATE OF CORRECTION

PATENT NO. : 6,127,724
DATED : October 3, 2000
INVENTOR(S) : DiStefano

It is certified that error appears in the above-identified patent and that said Letters Patent is hereby corrected as shown below:

Column 5, line 1, "encapsulant" should read --encapsulant,--.

Column 14, line 29, "claim" should read --claims--.

Column 14, line 55, "connected to a contacts" should read --connected to contacts--.

Column 15, line 1, "dielectric element" should read --dielectric elements--.

Column 16, line 4, "semicolon" should read --semiconductor--.

Column 16, line 48, "claim 23 or claim 24" should read --claim 24 or claim 25--.

Column 17, line 2, "semicolon" should read --semiconductor--.

Column 17, line 38, "terminal" should read --terminals--.

Column 18, line 21, after 15, delete "or".

Signed and Sealed this

Fifteenth Day of May, 2001

*Attest:*

NICHOLAS P. GODICI

*Attesting Officer*     Acting Director of the United States Patent and Trademark Office